United States Patent [19]

Hillman

[11] Patent Number: 5,953,828
[45] Date of Patent: Sep. 21, 1999

[54] SILICON SUBSTRATE CLEANING APPARATUS

[75] Inventor: Gary Hillman, Livingston, N.J.

[73] Assignee: S³Service Support Specialties, Inc., Montville, N.J.

[21] Appl. No.: 09/056,100

[22] Filed: Apr. 7, 1998

Related U.S. Application Data

[62] Division of application No. 08/582,368, Jan. 11, 1996, Pat. No. 5,735,962.

[51] Int. Cl.⁶ ..................................................... F26B 21/06
[52] U.S. Cl. ..................................... 34/74; 34/68; 34/468
[58] Field of Search ............................. 34/363, 468, 470, 34/471, 476, 68, 73, 77, 78, 74; 134/1.3, 2, 3, 31; 156/646

[56] References Cited

U.S. PATENT DOCUMENTS

| | | | |
|---|---|---|---|
| 4,911,761 | 3/1990 | McConnell et al. | 134/11 |
| 5,073,232 | 12/1991 | Ohmi et al. | 156/646 |
| 5,087,323 | 2/1992 | Park | 156/646 |
| 5,089,084 | 2/1992 | Chhabra et al. | 156/646 |
| 5,092,937 | 3/1992 | Ogura et al. | 134/30 |
| 5,105,556 | 4/1992 | Kurokawa et al. | 34/470 |
| 5,112,437 | 5/1992 | Watanabe et al. | 156/646 |
| 5,174,855 | 12/1992 | Tanaka | 156/646 |
| 5,232,511 | 8/1993 | Bergman | 134/2 |
| 5,238,500 | 8/1993 | Bergman | 134/3 |
| 5,238,503 | 8/1993 | Phenix et al. | 137/37 |
| 5,248,380 | 9/1993 | Tanaka | 156/626 |
| 5,288,333 | 2/1994 | Tanaka et al. | 134/31 |
| 5,314,574 | 5/1994 | Takahashi | 156/646 |
| 5,332,445 | 7/1994 | Bergman | 134/3 |
| 5,380,399 | 1/1995 | Miyashita et al. | 156/646 |
| 5,395,482 | 3/1995 | Onda et al. | 156/646 |
| 5,671,544 | 9/1997 | Yokomizo et al. | 34/78 |

OTHER PUBLICATIONS

HF Vapor Phase Etching (HF/VPE): Production Viability For Semiconductor Manufacturing and Reaction Model, Jan./Feb. 1980 Vacuum Science Technology, vol. 17, No. 1.

*Primary Examiner*—Henry Bennett
*Assistant Examiner*—Pamela A. Wilson
*Attorney, Agent, or Firm*—Lerner, David, Littenberg, Krumholz & Mentlik, LLP

[57] ABSTRACT

An apparatus for removing oxide from a silicon substrate having a silicon substrate temperature including an evaporation chamber having at least one inlet and at least one outlet, whereby a carrier gas can be passed through the evaporation chamber from the inlet to the outlet, means for introducing a preselected charge of a hydrous cleaning solution into the evaporation chamber, means for heating the preselected charge of the liquid cleaning solution to evaporate the charge completely and thereby form a mixture of vapors with the carrier gas flowing through the evaporation chamber, a heat exchanger connected to the outlet of the evaporation chamber for lowering the temperature or the mixture to below the silicon substrate temperature, a process chamber for holding the silicon substrate, the process chamber having an inlet connected to the heat exchanger and an outlet and an exhaust controller connected to the outlet of the process chamber for removing gas mixture from the process chamber.

10 Claims, 2 Drawing Sheets

SILICON SUBSTRATE CLEANING APPARATUS

This is a Divisional of U.S. Pat. application Ser. No. 08/582,368 filed Jan. 11, 1996, now U.S. Pat. No. 5,735,962, the benefit of which is claimed under 35 U.S.C. § 120.

FIELD OF THE INVENTION

The present invention relates generally to a method and apparatus for removing oxide from a silicon substrate.

BACKGROUND OF THE INVENTION

Many semiconductor devices are made of silicon. Silicon forms a stable oxide layer, silicon dioxide, on its surface when exposed to the atmosphere, sometimes referred to as "native" oxide. In previous years, when semiconductors had larger dimensions, this "native" oxide layer (9 to 15 angstroms) was an acceptable base for growing high quality oxides with a thickness around 1000 angstroms. Therefore, the native oxide could be left in place. Recently, however, the overall dimensions of semiconductors have been getting smaller. The purposefully grown oxide layers for use, for example, as FET gates, have been reduced to a thickness around 200 angstroms. At this thickness, the "native" oxide becomes an inhibitor to device quality and must be completely removed, prior to the growth of a high quality oxide layer to serve as a gate.

Numerous attempts have been made to develop a method and apparatus for removing oxide completely from a silicon substrate such as a semiconductor wafer without leaving undesirable residues on the substrate. More specifically, attempts have been made to develop a method and apparatus which could perform a series of cleaning cycles, with near consistent results, from one substrate to the next. However, these attempts have been unsatisfactory due to a number of problems.

For example, one problem arises when attempting to remove oxide from a silicon substrate with cleaning solution, such as Hydrofluoric acid ("HF"), in its liquid form. This is done by immersing the substrate in an aqueous HF bath. The surface of the substrate becomes hydrophobic and water droplets form on it. These water droplets create a major contamination problem. When the water droplets dry, they leave a residue of inorganic substances.

A further problem arises with attempts to utilize organic material such as isopropyl alcohol or methyl alcohol, to "get" the water droplets that remain from the above process, and thus alleviate the residue problem. Namely, a potentially harmful organic film is left on the substrate's surface.

Another attempt to remove oxide from a silicon substrate has been to use anhydrous HF. With this method, however, there is no substantial reduction of the oxide thickness. Therefore, this method does not achieve the desired oxide removal.

A further attempt at removing oxide from a silicon substrate has been to use energetic ion bombardment from plasma discharges. The principal difficulty here is that the discharges often affect the materials of construction of the chambers containing such discharges. This results in unwanted deposition of chamber constituent materials on the substrates which further results in contamination.

Yet another method is to use a vapor created from evaporating hydrous HF. An uncontaminated oxide-free surface results from this process because the substrate is stabilized by the presence of adherent hydrogen atoms on its surface. The difficulty presented with this method, however, lies in the inability to produce a consistent concentration of HF/water vapor since the mixture is azeotropic. That is, it is difficult to introduce an HF/water vapor of uniform stochiometry to the substrate. Previous methods of introducing the HF vapor and water vapor included the steps of bubbling a carrier gas through a liquid feed stock, then entraining the cleaning vapor with the carrier gas to the process chamber. The azeotropic nature of the feed stock would result in a continuously varying and unpredictable concentration of HF/water vapor in the carrier gas. This would lead to inconsistent and unpredictable results as far as cleaning the substrate is concerned.

An example of such a method is found in Tanaka, et al., U.S. Pat. No. 5,288,333, which includes a wafer-cleaning method and apparatus wherein a cleaning solution is caused to evaporate at a temperature below its boiling point. The cleaning vapor produced is applied at a temperature above its dew point to a wafer, such as a semiconductor wafer. It is difficult to consistently control the mixture or stochiometry of the HF/water vapor and carrier gas as it enters the process chamber to remove the oxide from the wafer. Moreover, it is more costly to perform this process since the Tanaka apparatus includes intricate controls and systems.

In addition, it is difficult to uniformly control or regulate the exhaust rate, and therefore the flow rate, of the mixture as it enters, reacts with the substrate within, and exits the process chamber.

Therefore, there is a need to perform a method that removes oxide from silicon substrates with substantially uniform etching and cleaning results from one substrate to the next (cycle to cycle) in a series of cleanings. There is a further need to perform this method using conditions which provide for consistent stochiometry, from cycle to cycle. Finally, there is a need to perform this method in a simpler, and less costly apparatus system and where the exhaust rate (or flow rate) is controlled or regulated to allow for repeatable, substantially uniform etching and cleaning results.

The copending, commonly assigned United States Patent Application of Gary Hillman, entitled "Flow Controlling Manometer", filed of even date herewith, (the "Manometer Application"), the disclosure of which is incorporated by reference herein, provides generally a manometer for use as a flow rate regulator or controller.

SUMMARY OF THE INVENTION

The present invention is directed to processes and apparatus that resolve these problems and limitations and satisfies these needs. One aspect of the present invention provides a method of removing oxide from a silicon substrate comprising the steps of providing a silicon substrate at a silicon substrate temperature, providing a preselected charge of hydrous cleaning solution to an evaporation chamber, evaporating the charge completely to produce a hydrous cleaning vapor from the hydrous cleaning solution and mixing the vapor with a dry carrier gas to create a mixture. The mixture is supplied to a heat exchanger to condense some water vapor from the mixture and to lower the dew point of the mixture to below the silicon substrate temperature. Finally, the mixture is supplied from the heat exchanger to the silicon substrate.

The method preferably includes the steps of providing the silicon substrate in a process chamber and purging the process and evaporation chambers with dry purge gas before the evaporation step is performed. This ensures that the chambers are free of any moisture before the substrate is treated with the hydrous cleaning vapor.

Yet, another aspect of the present invention comprises repeating the aforesaid steps in a series of cycles with a new substrate or several new substrates in each cycle and under substantially the same conditions to produce uniformly cleaned substrates. This method preferably includes the step of removing the water vapor that has condensed in the heat exchanger before the start of the next cycle. This ensures that no extra water vapor from one cycle will enter the process chamber thereby affecting the repeatability of HF concentration from cycle to cycle.

Thus, as in a preferred embodiment of the present invention, once the preselected amount of hydrous cleaning solution is selected and the heat exchanger and substrate temperatures are controlled to set the dew point of the resulting mixture to be below the substrate(s) temperature, the process is repeatable, cycle to cycle, with substantially uniform cleaning results. Complete evaporation of the hydrous cleaning solution at about or above the azeotropic temperature promotes consistent stochiometry from cycle to cycle.

As all of the solution is evaporated, and all of the vapor is entrained by the carrier gas and swept into the heat exchanger and subsequently into the substrate process chamber, the amount of hydrous cleaning solution introduced to the substrate(s) on each cycle is controlled solely by the amount of solution introduced, and hence can be controlled readily. The dew point of the vapors introduced to the substrate(s) is controlled almost entirely by the heat exchanger temperature, which is also readily controllable, whereas the residence time of the vapors in contact with the substrate(s) is controlled by the carrier gas flow rate and the exhaust controller. All of these parameters can be readily controlled and maintained over many cycles. Moreover, the process can be performed in a less costly and less complicated apparatus. Additionally, the process allows for minimal waste of hydrous cleaning solution and minimizes chemical waste that must be disposed in the environment.

A further aspect of the invention provides an apparatus for removing oxide from a silicon substrate. Preferred apparatus according to this aspect of the invention includes a process chamber for holding a silicon substrate, the process chamber having at least one inlet and at least one outlet. An evaporation chamber is provided for evaporating a discrete charge of hydrous cleaning solution rapidly and completely into a hydrous cleaning vapor and for introducing a dry carrier gas to the vapor to form a mixture. The evaporation chamber has at least one inlet for introduction of the dry carrier gas and at least one outlet for discharge of the mixture. The evaporation chamber desirably includes a mass, such as an open crucible or other vessel, and a heater for maintaining the mass at about or above the azeotropic temperature of the liquid to be introduced. The apparatus may further include means for feeding a preselected volume of the liquid solution into the chamber, desirably in dropwise form, so that the liquid solution impinges on the heated mass. A carrier gas source may be connected to one inlet of the evaporation chamber, and a hydrous cleaning solution source may connected to the feeding means.

The apparatus further comprises a heat exchanger for lowering the dew point of the mixture from the evaporation chamber to below the temperature of the silicon substrate in the process chamber, the heat exchanger having an inlet connected to an outlet of the evaporation chamber and an outlet connected to an inlet of the process chamber. The apparatus desirably further includes an exhaust device such as a vacuum pump for removing the hydrous cleaning vapor from the process chamber. The apparatus may include a controllable valve such as a dither valve connected between the process chamber and the exhaust controller for controlling the rate of exhaust from the process chamber. The apparatus desirably also includes a purge gas source connected to the other components of the system. A master system controller which can activate the system may also be provided.

This process produces silicon substrates which are substantially uniformly cleaned and can be controlled by initially setting the amount of hydrous cleaning solution used in each cycle and controlling the mixture and substrate temperatures.

These and other features, aspects and advantages of the present invention will become better understood with regard to the following description, appended claims, and accompanying drawings.

DETAILED DESCRIPTION OF THE PREFERRED EMBODIMENT

Figure 1:
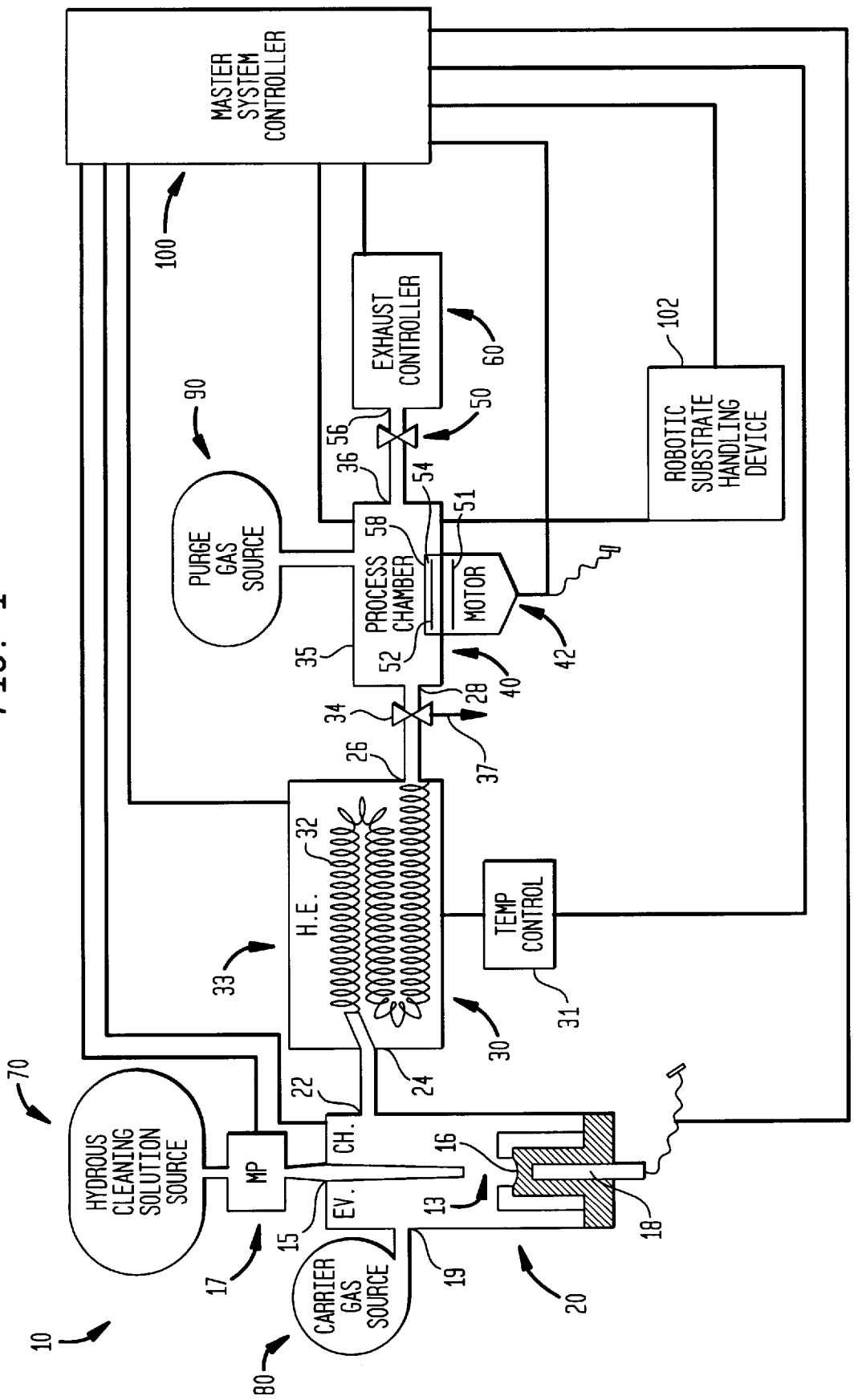
FIG. 1 is a diagrammatic sectional view of a cleaning apparatus according to one embodiment of the present invention.

A cleaning apparatus in accordance with one embodiment of the present invention generally designated 10 includes an evaporation chamber 20, which, in turn, communicates with a heat exchanger 30, which communicates with a process chamber 40. The process chamber 40 is connected through a regulating valve 50 to an exhaust controller 60. The apparatus further includes a hydrous cleaning solution source 70, a carrier gas source 80, a purge gas source 90, and a master system controller 100.

Carrier gas source 80 includes conventional pressure regulators and a tank filled with desired carrier gas. The evaporation chamber 20 is an air-tight enclosure. It has a first input 15 for receiving a preselected charge of hydrous cleaning solution that has been measured through a micrometering pump 17, and a second input 19 for receiving carrier gas from source 80. The evaporation chamber 20 has an output 22 which communicates with a first input 24 of the heat exchanger 30. The evaporation chamber is made from a material resistant to the corrosive effects of the hydrous cleaning solution and vapors. While the preferred embodiment of FIG. 1 discloses a generally cylindrical enclosure for the evaporation chamber, the chamber can be made of any number of shapes and sizes not limited to that disclosed in the preferred embodiment of the present invention.

A heated mass 16 is housed within the evaporation chamber 20 for receiving a preselected charge of hydrous cleaning solution and for evaporating it rapidly and completely. The heated mass 16 is a generally concave-shaped container or crucible made of silicon carbide, graphite-coated silicon carbide or silicon material capable of retaining and transferring heat, and also capable of withstanding the cleaning solution. The heated mass 16 is positioned directly below and in line with the first inlet 15 of the evaporation chamber 20 to which the charge of hydrous cleaning solution enters. The metering pump 17 has a discharge tip or pipette 13 within the chamber and aligned with mass 16. The metering pump may be a syringe-type pump adapted to discharge a small amount of liquid cleaning solution per discharge, typically about 0.04 cm$^3$ to about 0.06 cm$^3$ and preferably approximately 0.05 cm$^3$ in a series of discharges or droplets.

Directly below and in thermal communication with the heated mass 16 is a heating element 18 which heats the heated mass 16 to a temperature at about or above the azeotropic temperature of the hydrous cleaning solution. This can be any type of heating element capable of generating heat to be transferred to a mass.

Heat exchanger 30 includes an enclosure 33 and a tube 32 formed from Teflon® polytetrafluoroethylene or other corrosion-resistant material housed within the enclosure 33. Tube 32 of the heat exchanger 30 has a first inlet 24 in communication with the evaporation chamber outlet 22 and a first outlet 26 in communication with inlet 28 of the process chamber. The heat exchanger 30 also includes a temperature controller 31 which passes a heat exchange fluid through the enclosure 33 and regulates the temperature of the heat exchange fluid passing through. The heat exchanger thus regulates the temperature of the mixture as it passes through the tube 32.

A controllable three-port valve 34, referred to herein as the waste valve, is connected in-line between first outlet 26 of the heat exchanger 30 and the inlet 28 of the process chamber 40. The waste valve 34 is connected to a waste port 37. The waste valve is used for removing the water vapor that has condensed in the heat exchanger 30 after each cycle.

The process chamber 40 is an air-tight enclosure made from resistant material, such as PTFE or any material resistant to the mixture which enters the chamber to clean the silicon substrate housed within it. A substrate holder 54 is movably mounted within the process chamber 40, adjacent the bottom of the chamber. A driver 42, such as a motor, mounted beneath the chamber is linked to the substrate holder 54 by means of a magnet 52 mounted on the substrate holder and a similar magnet 51 attached to the motor. Motor 42 can drive magnet 51 in rotation, thereby creating a rotating magnetic field which drives magnet 52 and the substrate holder in rotation. Alternatively, the motor 42 and magnet 51 can be replaced by a series of stator coils and switching devices to energize the coils alternately and thereby provide the rotating magnetic field. Alternatively, the drive mechanisms may be arranged to move the substrate holder in an oscillating movement.

The process chamber 40 also includes at least one inlet 28 which communicates with the heat exchanger outlet 26 and at least one outlet 34 which communicates with the regulating valve 50. The inlets of the process chamber 40 may have port openings (not shown) disposed radially about the perimeter of the process chamber. Alternatively the port openings may be disposed at spaced-apart locations on the lid 35 of the chamber, above the substrate holder, so that an array of port openings faces toward the substrate holder. Such an array is commonly referred to as a "shower head" arrangement. The exhaust outlets 34 may have port openings disposed centrally or peripherally about the process chamber. The inlet and outlet arrangements are designed to make the flow of mixture through the chamber substantially uniform, over the entire surface of a substrate held on holder 54.

A regulating valve 50 is connected between the outlet 34 of the process chamber 40 and an inlet 56 of the exhaust controller 60. The regulating valve is preferably programmed to open or close for a duty cycle defined as a percentage of one second, namely 20% to 100% open or 200 milliseconds open to 1 second open per second. The regulating valve may be connected to a venturi or restrictor 61 which constitutes the exhaust connection of the processing system.

The exhaust controller 60 may include a vacuum pump 62 arrangement for creating a controlled subatmospheric pressure. The exhaust controller may also include a flow controlling manometer system 63 in accordance with one embodiment of the present invention with a floating regulator body 64 for controlling the vacuum applied to the exhaust connection or venturi 61 of the process system and thus controlling the flow rate of the mixture in the process chamber 40.

The manometer system 63 is more fully described in the above-mentioned copending, commonly assigned Manometer Application of Gary Hillman but is described herein for completeness. The manometer system 63 includes a chamber 65 made from material resistant to hydrous cleaning vapors. A gas inlet port 67 and gas outlet port 68 are open to the chamber 65. Inlet port 67 is connected to the process system exhaust connection or venturi 61 to receive the gas mixture exhausting from the process chamber 40. Outlet port 68 is connected to the vacuum pump 62 through a manifold 72. Other process flow systems (not shown) which exhaust gases and vapors at various times may be connected to manifold 72 as well.

A U-shaped liquid-filled manometer 66 is disposed within the manometer system chamber 65. The manometer has a first vertically-extensive tubular leg 73 communicating with the interior of chamber 65 through an opening or port 75 at the top end of the leg. The manometer also includes a second vertically-extensive tubular leg 77 having an outlet or port 69 at its top end communicating with the atmosphere. The manometer further includes a passageway 79 connecting the two legs 73 and 77. A liquid 81 is disposed in the manometer. The liquid should be selected so that it does not react with the gasses passing through chamber 65 during operation. For many common processes, oils such as common petroleum-based lubricating oil, vegetable oil and silicone oil are satisfactory. As further discussed below, the viscosity of the oil as well as the diameter and configuration of the manometer elements influence the degree of damping in the system. For typical system in which leg 73 has an inside diameter of about 4", whereas leg 77 and passageway 79 have inside diameters of about ½", an oil of about 40 wt. centipoise viscosity provides satisfactory results.

A regulator body 64, floats in liquid 81 within first leg 73. A conical valve body 71 is rigidly mounted to the regulator body 64 by a rod formed integrally with the regulator body and extending through opening 75, so that the regulator body supports the valve body above the upper end or opening 75 of the manometer leg. Outlet or port 68 is aligned with leg 73 and with port 75, and thus is aligned with the floating regulator body 64 and valve body 71. The valve body is disposed adjacent outlet 68 and partially received in the open end of the outlet, so that the valve body partially occludes the outlet.

A robotic substrate handling device 102 or another conventional conveying system is used to provide a series of the silicon substrates 58 to the process chamber 40, and to remove each substrate or series of substrates after processing.

The master system controller 100 is a computer-driven sensing and controlling device which is in electrical cooperation with various components of the system 10 including the evaporation chamber 20, the micrometering pump 17, the heating element 18, the heat exchanger 30, the process chamber 40, the motor 42, the exhaust controller 60, and the robotic substrate handling device 102.

In operation, a first substrate, such as a silicon substrate or a semiconductor wafer, is moved to the process chamber 40 by the use of the robotic substrate handling device 102. The substrate is placed on the substrate support in flat, horizontal orientation with the surface to be cleaned facing up. This may also be performed manually by the user. Once the substrate is in place within the process chamber 40, the process chamber is sealed and the atmosphere captured therein is replaced by a flow of very dry purge gas, such as nitrogen, from the purge gas source 90. This step displaces any moisture that may be present within the process chamber at this time. The substrate is brought to or maintained at the desired substrate temperature. The purge gas may be preheated so as to bring the chamber and substrate to the desired temperature.

Alternatively or additionally, substrate holder 54 may include a heater (not shown). If the desired substrate temperature in the process corresponds to the ambient temperature of the environment surrounding the system, the substrate and process chamber can be maintained at the desired substrate temperature by heat transfer to and from the environment.

Figure 2:
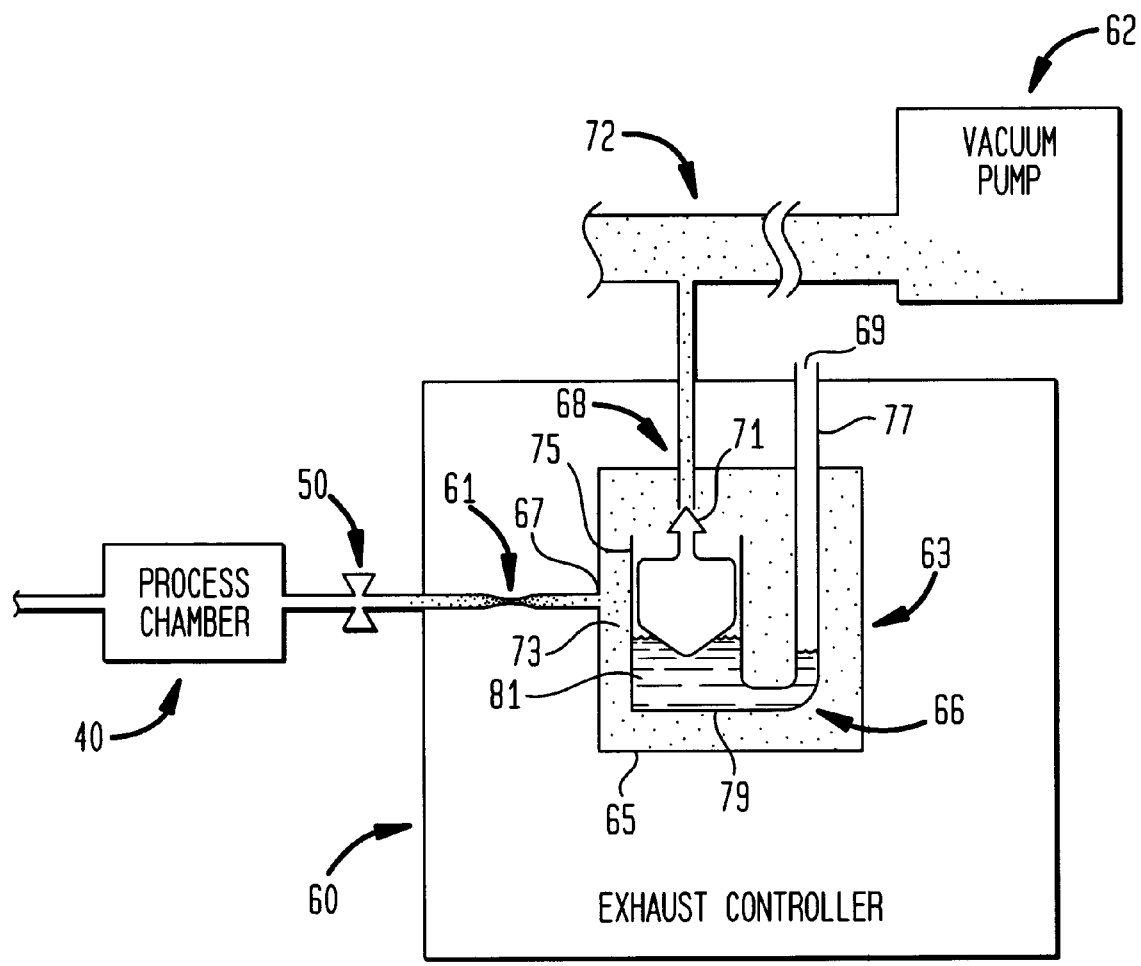
FIG. 2 is a diagrammatic sectional view of the process chamber, regulating valve and exhaust controller of FIG. 1.

The evaporation chamber 20 is also purged with dry purge gas from the purge gas source 90. Heat exchanger 30 is brought to a preselected heat exchanger temperature below the substrate temperature. A dry carrier as, such as nitrogen, is directed through the system starting at the vaporation chamber 20 at a preselected flow rate, desirably between about 10 and about 50 liters/minute, most preferably approximately 30 liters per minute. The mixture is exhausted from the process chamber 40 through outlet 34 and exhaust controller 60. The rate at which this exhaust occurs, and hence the flow rate through the system, is controlled by controlling the regulating valve 50 duty cycle, while using the manometer system 63 to maintain a substantially constant pressure in chamber 65 and thereby apply a substantially constant pressure at the exhaust 61 of the process system. The pressure within the process chamber 40 is a function of the regulating valve duty cycle, the pressure applied by carrier gas source 80 and the subatmospheric pressure in the chamber 65 (FIG. 2) of the exhaust controller 60. Preferably, the pressure in the process chamber is at about atmospheric pressure.

The manometer system 63 regulates the exhaust rate and, therefore, the flow of exhaust through the outlet 68 and thereby maintain a fixed pressure in chamber 65 in the following manner. The opening 69 of the second manometer leg 77 is at atmospheric pressure. The pressure in chamber 65 is controlled by the relative rates of gas flow into the chamber (through inlet 67) and gas flow out of the chamber (through outlet 68). The liquid, e.g., oil, in the manometer rises or lowers accordingly. For example, if the pressure in the process chamber is below atmospheric pressure, the liquid which supports the floating regulator body 64 will rise, thus forcing the regulator body 64 to rise. This causes the top of the regulator 71 to approach the outlet 68 and further restrict the flow of mixture from the chamber to manifold 72. This restriction in flow will then cause the pressure in the chamber 65 of manometer system 63 to increase until it more closely approaches atmospheric pressure. This will cause the fluid to lower, causing the floating regulator body 64 to drop and the gas mixture to flow through the outlet 68 with less restriction.

The system will tend to settle at a set point pressure. This pressure will remain until the pressure in the process chamber 40 or the duty cycle of valve 50 changes or until the flow of gases out of outlet 68 changes due to a change in the pressure prevailing in the manifold 72. When any such change occurs, the exhaust controller 60 will adjust according to the above-mentioned process to bring the system back to its set point pressure. As the system adjusts to external disturbances, liquid 81 flows through passageway 79 to or from leg 75. The flow is retarded by the viscous action of the liquid itself. This assures that the degree of occlusion of the output port will increase or decrease gradually, and that the regulator body and valve body will not overshoot the position required to maintain the set point pressure. Thus, the exhaust controller 60 insures that the cleaning process is repeatable from cycle to cycle with substantially uniform etching or cleaning of each substrate in the series of cycles.

The heated mass 16 is then prepared by being heated to about or above the azeotropic temperature of the hydrous cleaning solution. In the case of hydrous hydrofluoric acid (HF), the azeotropic temperature is approximately 113° C. Next, the micrometering pump 17 pumps a preselected charge of the hydrous cleaning solution, such as HF, into the heated mass 16. The charge is supplied as a drop or a few drops of the solution. As the solution encounters the heated mass, it boils rapidly or "flashes" to vapor, so as to form a mixture of hydrous cleaning solution vapors (HF vapor and water vapor) with the carrier gas.

The mixture of vapor and carrier gas then enters the heat exchanger 30. The mixture is cooled to a temperature below the substrate temperature. The cooling temperature is controlled by the temperature controller 31. As the mixture is cooled, some water vapor condenses from it and its dew point temperature falls below the silicon substrate temperature. This is performed so that any moisture which may condense in the system does so in the heat exchanger 30 and not on the silicon substrate 58 itself.

The mixture passes from the heat exchanger to the process chamber 40. The motor 42 drives substrate holder 54 and thus moves the substrate 58 within the chamber. This movement promotes even distribution of the gas mixture over the substrate surface.

The composition of the gas mixture changes during the process. The sudden evaporation of the hydrous cleaning solution produces a bolus of vapor which travels downstream through the heat exchanger to the process chamber. Therefore, using HF, when the mixture first enters the process chamber 40, it contains a relatively high concentration of HF. Because much of the water vapor included in the HF vapor is removed in the heat exchanger, the vapors include only a small amount of water vapor. There is adequate water vapor for the chemical reaction between the silicon substrate's surface and the mixture but not enough to condense on the substrate.

As the process continues, the concentration of the gas entering the chamber changes; the HF concentration decreases, the carrier gas concentration increases, whereas the water vapor concentration remains fixed at the concentration corresponding to a dew point equal to the temperature of the heat exchanger.

After the cleaning cycle for one substrate has been completed and before the substrate is removed, the process chamber 40 is purged by continuing the flow of dry heated purged gas, such as nitrogen. This insures that carrier gas does not cool the substrate below the dew point of the gas in contact with the substrate.

The condensed water vapor in the heat exchanger 30 is then purged from the heat exchanger 30, through the waste valve 34 and out the waste port 37. Dry purging gas is passed through the heat exchanger during his process to assist in water removal. Once the heat exchanger has been urged of water in this fashion, the apparatus is ready for a further cycle.

The above process is then repeated for the next cycle with a new substrate ready to be cleaned.

As pointed out above, the composition of the gas mixture passing though the chamber changes over time during each cycle. Provided that process variables such as heat exchanger temperature, carrier gas flow rate and the temperature of the heated mass in the evaporation chamber are maintained constant over plural cycles, the profile or pattern of stochiometry versus time will be the same on each cycle. Therefore, each substrate will be exposed to substantially the same conditions. Thus, each substrate is cleaned with substantially the same resulting etching or cleaning characteristics. This allows for repeatable, uniform oxide cleaning of a series of substrates.

By providing a preselected quantity of hydrous cleaning solution which can be evaporated completely and rapidly upon contact with the heated mass or crucible at about or above the azeotropic temperature of the hydrous cleaning solution, the complete and rapid evaporation of a measured quantity of solution is assured. Therefore, the charge of cleaning solution vapors introduced into the system will depend solely on the amount of liquid solution applied. This facilitates provision of a uniform hydrous cleaning vapor concentration on successive cycles.

Also, by including the manometer system 63, the pressure at the venturi or process outlet of the system may be kept relatively constant from cycle to cycle. This also facilitates the repeatability of the process with substantially uniform cleaning and etching results from substrate to substrate in a series of cycles. For example, where another process system connected to manifold 72 expels different amounts of gas at different times, so as to cause the pressure within manifold 72 to vary during different cycles of the wafer cleaning process system, the pressure at the process system outlet or venturi 61 will remain fixed.

Because the gas mixture impinging on the substrate has a dew point temperature below the substrate temperature, water will not condense from the gas mixture on to the substrate. Thus, the process removes the native oxides from a silicon or similar substrate without leaving a residue, particulate or organic matter.

Moreover, the process uses a minimum amount of cleaning solution. This, thereby, minimizes both chemical costs and chemical disposal costs while also minimizing unwanted pollution to environment caused by the release or disposal of such chemical reactants.

Although the present invention has been described in considerable detail with reference to certain preferred versions thereof, other versions are possible. For example, the chambers and enclosures may be made of any material that can resist the ravages of hydrous cleaning solutions, especially hydrous HF. These include fluouropolymers and silicon, silicon carbide and platinum. Additionally, the mixture may be caused to remain in the process chamber for a predetermined dwell time, desirably about from about 5 seconds to about 10 seconds, without flow by closing the regulating valve 50 to block the flow for the desired dwell time. During this step, the gas mixture continues to react with the oxide layer on the substrate. Manometer system 63 reacts to minimize pressure fluctuations in chamber 65 caused by any such closure of valve 50. The carrier gas and the purge gas sources may feed each other or communicate with each or alternatively be the same source for both purging and carrying. Also, plural substrates may be processed within the process chamber on each cycle. With regard to providing the substrates to the process chamber, this may be done manually as well as automatically as described above. Further, the flow rate control can utilize one or more throttling valves in place of the regulating valve 50. The regulating valve may be a dither valve including a movable shuttle.

Additionally, the mixture may be caused to remain in the process chamber without the flow of carrier gas from about 5 seconds to about 10 seconds by controlling the duty cycle of the regulating valve or other throttling valves. This step may include evaporation of another charge of HF, depending on the desired etch rate.

Also, the sudden and complete evaporation of the hydrous cleaning solution can be performed using techniques other than the heated mass discussed above. Thus, the carrier gas may be heated well above the azeotropic temperature, so that the cleaning solution is instantaneously evaporated by contact with the carrier gas. Also, radiant energy such as light or microwave energy may be applied to the liquid entering the evaporation chamber.

As these and other variations and combinations of the features described above can be used, the spirit and scope of the appended claims should not be limited to the description of the preferred versions contained herein.

What is claimed is:

1. An apparatus for removing oxide from a silicon substrate having a silicon substrate temperature comprising an evaporation chamber having at least one inlet and at least one outlet, whereby a carrier gas can be passed through said evaporation chamber from said inlet to said outlet, means for introducing a preselected charge of a hydrous cleaning solution into said evaporation chamber, means for heating said preselected charge of said liquid cleaning solution to evaporate said charge completely and thereby form a mixture of vapors with said carrier gas flowing through said evaporation chamber, a heat exchanger connected to said outlet of said evaporation chamber for lowering the temperature of said mixture to below said silicon substrate temperature, a process chamber for holding said silicon substrate, said process chamber having an inlet connected to said heat exchanger and an outlet and (f) an exhaust controller connected to said outlet of said process chamber for removing gas mixture from said process chamber.

2. The apparatus of claim 1 wherein said means for introducing said preselected charge of said hydrous cleaning solution includes a micrometering pump.

3. The apparatus of claim 1 wherein said means for heating said charge includes a mass disposed in said evaporation chamber and means for heating said mass, said means for introducing said charge being arranged to introduce the hydrous cleaning solution so that it impinges on said mass.

4. The apparatus of claim 3 wherein said means for heating the mass is adapted to maintain said mass at a temperature above an azeotropic temperature of said hydrous cleaning solution.

5. The apparatus of claim 3 wherein said means for heating the mass is adapted to maintain said mass at a temperature about an azeotropic temperature of said hydrous cleaning solution.

6. The apparatus of claim 1 further comprising a carrier gas source connected to said inlet of said purge chamber, and a hydrous cleaning solution source connected to said charge introducing means.

7. The apparatus of claim 1 further comprising a temperature controller connected to said heat exchanger.

8. The apparatus of claim 1 further comprising a waste valve for removing water vapor from said heat exchanger, connected between said heat exchanger and said process chamber.

9. The apparatus of claim 1 further comprising a substrate holder disposed in said process chamber and a driver for moving said substrate holder.

10. The apparatus of claim 9 wherein said driver includes a motor disposed outside of said process chamber, a magnet outside of said process chamber connected to said motor for movement by said motor and a magnet inside said process chamber connected to said substrate holder, said inside magnet and said outside magnet being magnetically linked with one another.

* * * * *

UNITED STATES PATENT AND TRADEMARK OFFICE
CERTIFICATE OF CORRECTION

PATENT NO. : 5,953,828
DATED : September 21, 1999
INVENTOR(S) : Gary Hillman

It is certified that error appears in the above-identified patent and that said Letters Patent is hereby corrected as shown below:

On cover page, Assignee: "S³Service" should read -- S³ Service--.
In Abstract, line 12, "or" should read --of--.
Column 7, line 30, "as" (1st occurrence) should read --gas--.
Column 7, line 31, "vaporation" should read --evaporation--.
Column 9, line 4, "his" should read --this--.
Column 9, line 5, "urged" should read --purged--.

Signed and Sealed this

Sixth Day of June, 2000

*Attest:*

Q. TODD DICKINSON

*Attesting Officer*   *Director of Patents and Trademarks*